(12) United States Patent
Courson et al.

(10) Patent No.: US 11,398,363 B2
(45) Date of Patent: Jul. 26, 2022

(54) CIRCUIT INTERRUPTERS WITH LOCKOUT FEATURE AND RELATED METHODS

(71) Applicant: Eaton Intelligent Power Limited, Dublin (IE)

(72) Inventors: Andrew William Courson, McGrann, PA (US); Jason Kohei Okerman, Pittsburgh, PA (US)

(73) Assignee: Eaton Intelligent Power Limited, Dublin (IE)

(*) Notice: Subject to any disclaimer, the term of this patent is extended or adjusted under 35 U.S.C. 154(b) by 484 days.

(21) Appl. No.: 16/666,957

(22) Filed: Oct. 29, 2019

(65) Prior Publication Data

US 2020/0136365 A1 Apr. 30, 2020

Related U.S. Application Data

(60) Provisional application No. 62/752,590, filed on Oct. 30, 2018.

(51) Int. Cl.
| | | |
|---|---|---|
| *H01H 71/10* | (2006.01) | |
| *H02H 1/00* | (2006.01) | |
| *H01H 85/30* | (2006.01) | |
| *H01H 9/10* | (2006.01) | |
| *G01R 31/50* | (2020.01) | |
| *G01R 31/327* | (2006.01) | |

(Continued)

(52) U.S. Cl.
CPC ....... *H01H 71/1054* (2013.01); *G01R 31/327* (2013.01); *G01R 31/50* (2020.01); *H01H 9/104* (2013.01); *H01H 71/0207* (2013.01); *H01H 71/10* (2013.01); *H01H 85/30* (2013.01); *H02H 1/0015* (2013.01); *H01H 2071/044* (2013.01)

(58) Field of Classification Search
CPC .............. H01H 9/104; H01H 71/0207; H01H 71/1054; H01H 71/10; H01H 85/30; H01H 2070/044; G01R 31/327; G01R 31/50; G01R 31/3278; H02H 1/2015
USPC .......................................................... 335/35
See application file for complete search history.

(56) References Cited

U.S. PATENT DOCUMENTS 4,167,769 A 9/1979 Luke et al.
4,351,583 A 9/1982 Belttary
(Continued)

FOREIGN PATENT DOCUMENTS

| CN | 102097258 B | * | 10/2014 | ............... H01H 1/54 |
| DE | 102004062266 A1 | * | 7/2006 | ........... H01H 1/0015 |
| EP | 1760747 A2 | * | 3/2007 | ............. H01H 71/40 |

*Primary Examiner* — Kevin J Comber
(74) *Attorney, Agent, or Firm* — Myers Bigel, P.A.

(57) ABSTRACT

Circuit breakers are disclosed that include a housing with a line side and a load side, a printed circuit board in the housing, a movable contact arm with an electrical contact, a stationary line side contact, a primary trip solenoid in the housing coupled to the printed circuit board, an armature in the housing, a bimetal member in the housing adjacent the armature and adjacent the primary trip solenoid; and a lockout assembly in the housing. The lockout assembly includes a rod configured to have a first inactive position and a second lockout position. When in the second position and/or as the rod travels to the second lockout position, the rod directly or indirectly pushes the armature toward the bimetal member to physically lock out the circuit breaker to prevent conduction and separate the line side contact from the movable contact arm electrical contact.

20 Claims, 9 Drawing Sheets

(51) Int. Cl.
*H01H 71/02* (2006.01)
*H01H 71/04* (2006.01)

(56) References Cited

U.S. PATENT DOCUMENTS

| | | |
|---|---|---|
| 4,503,408 A | 3/1985 | Mrenna et al. |
| 4,736,174 A | 4/1988 | Castonguay et al. |
| 4,743,204 A | 5/1988 | Fromm et al. |
| 4,785,377 A | 11/1988 | Rhodes |
| 4,786,885 A | 11/1988 | Morris et al. |
| 5,117,211 A | 5/1992 | Morgan et al. |
| 6,591,482 B1 | 7/2003 | Fleege et al. |
| 7,449,645 B1 | 11/2008 | Flegel |
| 7,957,122 B2 | 6/2011 | Sharp |
| 8,049,126 B2 | 11/2011 | Chen et al. |
| 8,222,983 B2 | 7/2012 | Zhou et al. |
| 9,112,336 B2 | 8/2015 | Samuelson |
| 9,184,525 B1 | 11/2015 | Ranta |
| 9,627,164 B2 | 4/2017 | Robinson et al. |
| 9,666,398 B2 | 5/2017 | Robinson et al. |
| 10,020,152 B2 | 7/2018 | Pearson et al. |
| 2008/0158788 A1 | 7/2008 | Darr et al. |
| 2008/0289938 A1 | 11/2008 | Raabe et al. |
| 2012/0132506 A1* | 5/2012 | Potratz ............... H01H 9/20 200/43.11 |
| 2013/0188297 A1 | 7/2013 | Ranta |
| 2014/0168862 A1 | 6/2014 | Wheeler |
| 2017/0309431 A1 | 10/2017 | Hiremath et al. |
| 2019/0019636 A1 | 1/2019 | Maloney et al. |
| 2019/0109452 A1 | 4/2019 | Jimenez et al. |
| 2019/0180966 A1 | 6/2019 | Gibson |
| 2020/0035436 A1* | 1/2020 | Packard ............... H01H 83/04 |

\* cited by examiner

CIRCUIT INTERRUPTERS WITH LOCKOUT FEATURE AND RELATED METHODS

RELATED APPLICATIONS

This application claims priority to and the benefit of U.S. Provisional Patent Application Ser. No. 62/752,590 filed Oct. 30, 2018, the contents of which are hereby incorporated by reference as if recited in full herein.

FIELD OF THE INVENTION

The present invention relates to circuit interrupters.

BACKGROUND OF THE INVENTION

Circuit interrupters provide overcurrent protection devices used for circuit protection and isolation. The circuit breaker provides electrical protection whenever an electric abnormality occurs. For example, Arc Fault Circuit Interrupters (AFCI) and Ground Fault Circuit Interrupters (GFCI) are among a variety of overcurrent protection devices used for circuit protection and isolation. Arc Fault Circuit Interrupters (AFCIs) reduce fire hazards in electrical circuits by reducing the effects of high current arcing faults (parallel arcs) as well as detecting persistent low-current arcing faults (series arcs). Ground Fault Circuit Interrupters reduce the potential of electrical shock. Dual purpose AFCI/GFCI breakers are available which provide GFCI protection and AFCI protection as combination type breakers from Eaton Corporation. The circuit interrupters can provide conventional thermal and magnetic overcurrent protection.

In a typical circuit breaker, current enters the system from a power line and passes through a line conductor to a stationary contact fixed on the line conductor, then to a movable contact. The movable contact is fixedly attached to a pivoting arm. Arc chutes can be used to direct an arc away from the electrical contacts into the arc chute. The arc chute is situated proximate to the stationary contact of the circuit. As long as the stationary and movable contacts are in physical contact, current passes between the stationary contact and the movable contact and out of the circuit breaker to down-line electrical devices.

In the event of an overcurrent condition (e.g., a short circuit), extremely high electromagnetic forces can be generated. The electromagnetic forces can be used to separate the movable contact from the stationary contact. Upon separation of the contacts and blowing open the circuit, an arcing condition occurs. The breaker's trip unit will trip the breaker which will cause the contacts to separate. Also, arcing can occur during normal "ON/OFF" operations of the breaker.

Electronic circuit breakers such as thermal-magnetic circuit breakers can contain two different switching mechanisms, a bimetal switch and an electromagnet. The bimetal serves as a way of handling overcurrent. The bimetal switch or member typically sits behind a trip bar and is part of the current carrying path.

Conventionally, in the event of multiple electronic safety features being compromised or successive faults can occur and trigger the breaker to trip. However, the circuit breaker can continue to be reset and energized which may give a user a false sense of protection.

SUMMARY OF EMBODIMENTS OF THE INVENTION

Embodiments of the invention are directed to circuit interrupters with a lockout feature that prevents the breaker from being reset and energized, at least without factory repair, so that an installed circuit interrupter can no longer ever allow current conduction between a line and a load side once the lockout feature is triggered and deployed based on one or more defined events and/or conditions of internal components.

Embodiments of the invention are directed to a circuit breaker that includes: a housing with a line side and a load side; a printed circuit board in the housing; a movable contact arm with an electrical contact; a stationary line side electrical contact; a primary trip solenoid in the housing coupled to the printed circuit board; an armature in the housing; a bimetal member in the housing adjacent the armature and adjacent the primary trip solenoid; and a lockout assembly in the housing. The lockout assembly includes a rod configured to have a first inactive position and a second lockout position. Only when in the second lockout position and/or as the rod travels to the second lockout position, the rod directly or indirectly pushes the armature toward the bimetal member to physically lock out the circuit breaker to prevent conduction and separate the line side electrical contact from the movable contact arm electrical contact.

The lockout assembly can include a control device that anchors the rod in the first position, pre-installation and during in service operation. The control device can be configured to allow the rod to slidably advance only a single time to the second lockout position in response to an electronically automatically identified end-of-life condition.

The circuit breaker can also include a resilient biasing member that cooperates with the rod. The resilient biasing member can be configured to have a compressed state when the rod is in the first position to have stored potential energy. The resilient biasing member can be configured to apply the stored potential energy to the rod when released by the control device to force the rod to slidably travel to the second lockout position.

The control device can have a component that allows electric current above a defined threshold to fuse open the component and release the rod.

The rod can have a leading end that faces the armature. The leading end can be perpendicular to a primary body segment of the rod.

The leading end can extend through an aperture in the printed circuit board adjacent a plunger of the primary trip solenoid.

The primary trip solenoid can include a plunger and/or flag that has a leading end that is perpendicular to a primary body of the primary trip solenoid. The leading end can extend through the aperture or a different aperture in the printed circuit board adjacent the leading end of the rod.

The rod can have a leading end that faces the armature. The leading end can be perpendicular to a primary body segment of the rod and can also be perpendicular to an axis of translation of a plunger of the primary trip solenoid, behind a leading end of the plunger. The leading end of the rod can force the leading end of the plunger and/or a flag thereon to move forward as the leading end of the rod moves to the second lockout position.

The rod can be held by a middle base of the housing.

The middle base can have a first aperture that allows a flag of a plunger to extend therethrough. The middle base can have a second aperture that allows a leading end of the rod to extend therethrough adjacent the flag of the plunger.

The middle base can have an aperture that allows a flag of a plunger to extend therethrough and that also allows a leading end of the rod to concurrently extend therethrough adjacent the flag of the plunger.

The rod can be held by a top cover of the housing.

The rod can be held by the printed circuit board.

The rod can be held by a bottom cover of the housing.

The rod can be coupled to an external casing of the primary trip solenoid.

The circuit breaker can be an Arc Fault Circuit Interrupter (AFCI), a Ground Fault Circuit Interrupter (GFCI) or a dual purpose AFCI/GFCI circuit breaker.

The circuit breaker can further include a coil spring coupled to the rod and a control device coupled to the rod, spaced apart from a leading end of the rod. The control device can include a fusible wire or fusible polymeric or plastic link that is attached to the rod in the first inactive position.

The current can be applied to fuse a wire to release the rod or to heat a meltable link to release the rod.

The circuit breaker can further include a control circuit in communication with a control device that is coupled to the rod. The control circuit can be configured to trigger the control device to provide current above to controllably deploy the rod of the lock-out assembly to the second lockout position only when an end of life condition is identified, optionally based on one or more of: a defined number of successive failed self-tests of a self-test circuit onboard the circuit breaker; an identified failure or degradation in a defined performance parameter or parameters of electronic components in the circuit breaker; AFCI or GFCI protection features are at least one of inoperable, outside defined operating parameters or malfunctioning; or solenoid or SCR (silicon controlled rectifier) components of a primary electronic trip path are shorted, burned or otherwise damaged.

Other embodiments are directed to a method of operating a current interrupter. The method includes: providing a circuit interrupter with a permanent lockout assembly; electronically monitoring or testing or monitoring and testing for defined end-of-life conditions or events of the circuit interrupter; and automatically deploying a rod of a lock out assembly to slide toward an armature and push the armature toward a bimetal member to permanently block conduction of the circuit interrupter.

The deployment of the rod of the lock-out assembly can be carried out a single time and only when an end of life condition is identified.

The monitoring or testing or monitoring and testing for the defined end-of-life conditions or events comprises one or more of electronically: determining a defined number of failures of successive self-tests of a self-test circuit; identifying a failure or degradation in a defined performance parameter or parameters of electronic components in the circuit interrupter; determining that AFCI or GFCI protection features are inoperable, outside defined operating parameters or malfunctioning; or determining that a primary trip solenoid or SCR (silicon controlled rectifier) component of a primary electronic trip path is shorted, burned or otherwise damaged.

Embodiments of the invention can provide a permanent lockout feature that prevents the thermal-magnetic circuit from being reset. The permanent lockout feature can include an electro-mechanical or mechanical member that can push an armature toward a bimetal member when deployed to provide the permanent lockout function thereby preventing the breaker from being reset or trips a cradle and/or movable arm causing contacts to open if the breaker was in a closed position.

Further features, advantages and details of the present invention will be appreciated by those of ordinary skill in the art from a reading of the figures and the detailed description of the preferred embodiments that follow, such description being merely illustrative of the present invention.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

DETAILED DESCRIPTION OF EMBODIMENTS OF THE INVENTION

Figure 1:
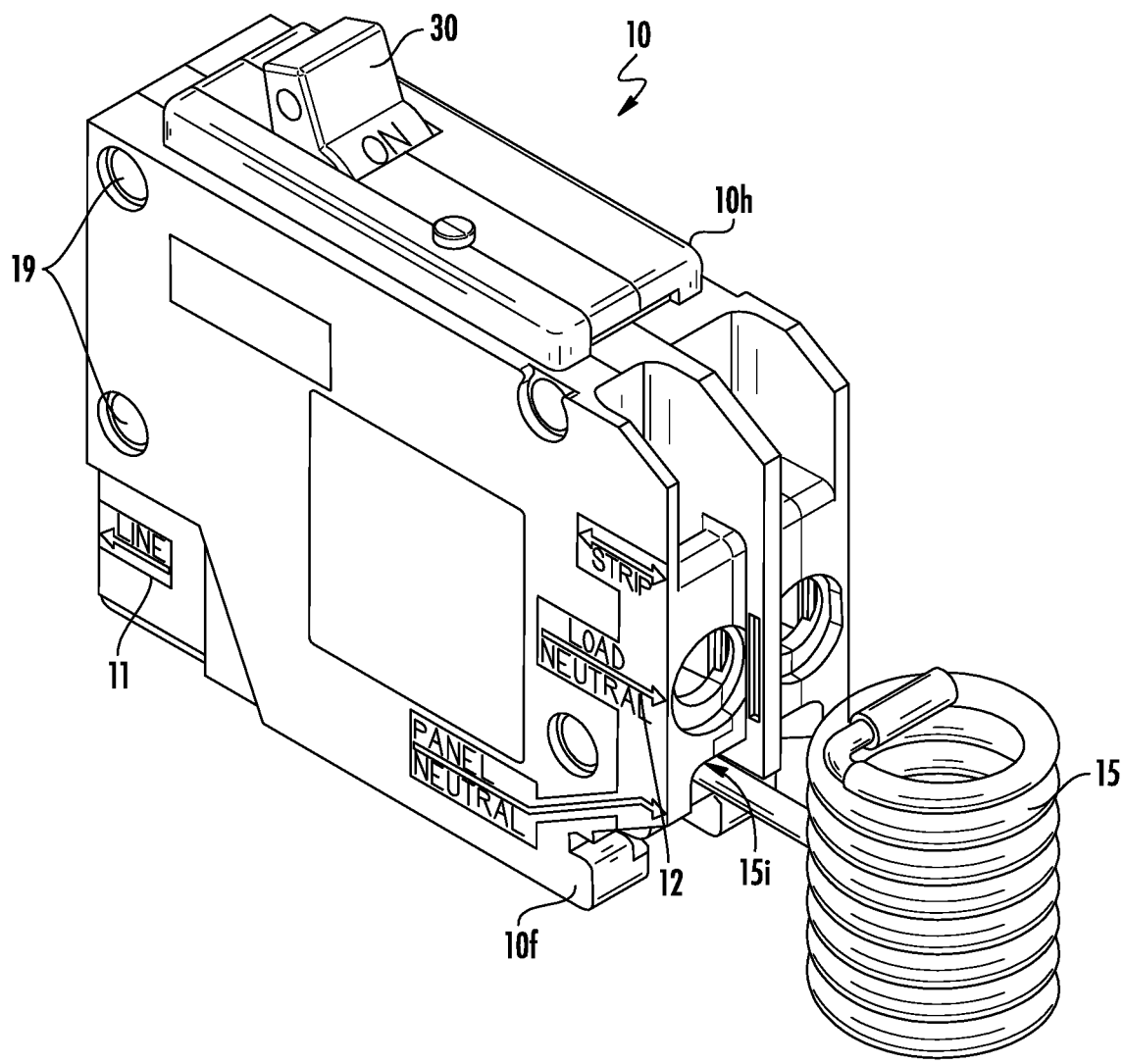
FIG. 1 is a side perspective view of an example circuit breaker.

The present invention now will be described more fully hereinafter with reference to the accompanying drawings, in which illustrative embodiments of the invention are shown. Like numbers refer to like elements and different embodiments of like elements can be designated using a different number of superscript indicator apostrophes (e.g., 10, 10', 10", 10'").

In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art. The term "FIG." (whether in all capital letters or not) is used interchangeably with the word "Figure" as an abbreviation thereof in the specification and drawings. In the figures, certain layers, components or features may be exaggerated for clarity, and broken lines illustrate optional features or operations unless specified otherwise. In addition, the sequence of operations (or steps) is not limited to the order presented in the claims unless specifically indicated otherwise.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass orientations of above, below and behind. The device may be otherwise oriented (rotated 90° or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

The term "about" refers to numbers in a range of +/−20% of the noted value.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

The term "non-ferromagnetic" means that the noted component is substantially free of ferromagnetic materials so as to be suitable for use in the arc chamber (non-disruptive to the magnetic circuit) as will be known to those of skill in the art.

Embodiments of the present invention are directed to circuit interrupters that include internal permanent lockout features or components to prevent re-energization or conduction of current at an end of life condition. The figures illustrate circuit breakers as an example circuit interrupter but embodiments of the present invention may be useful for other circuit interrupters including fused disconnect switches, for example.

Figure 2:
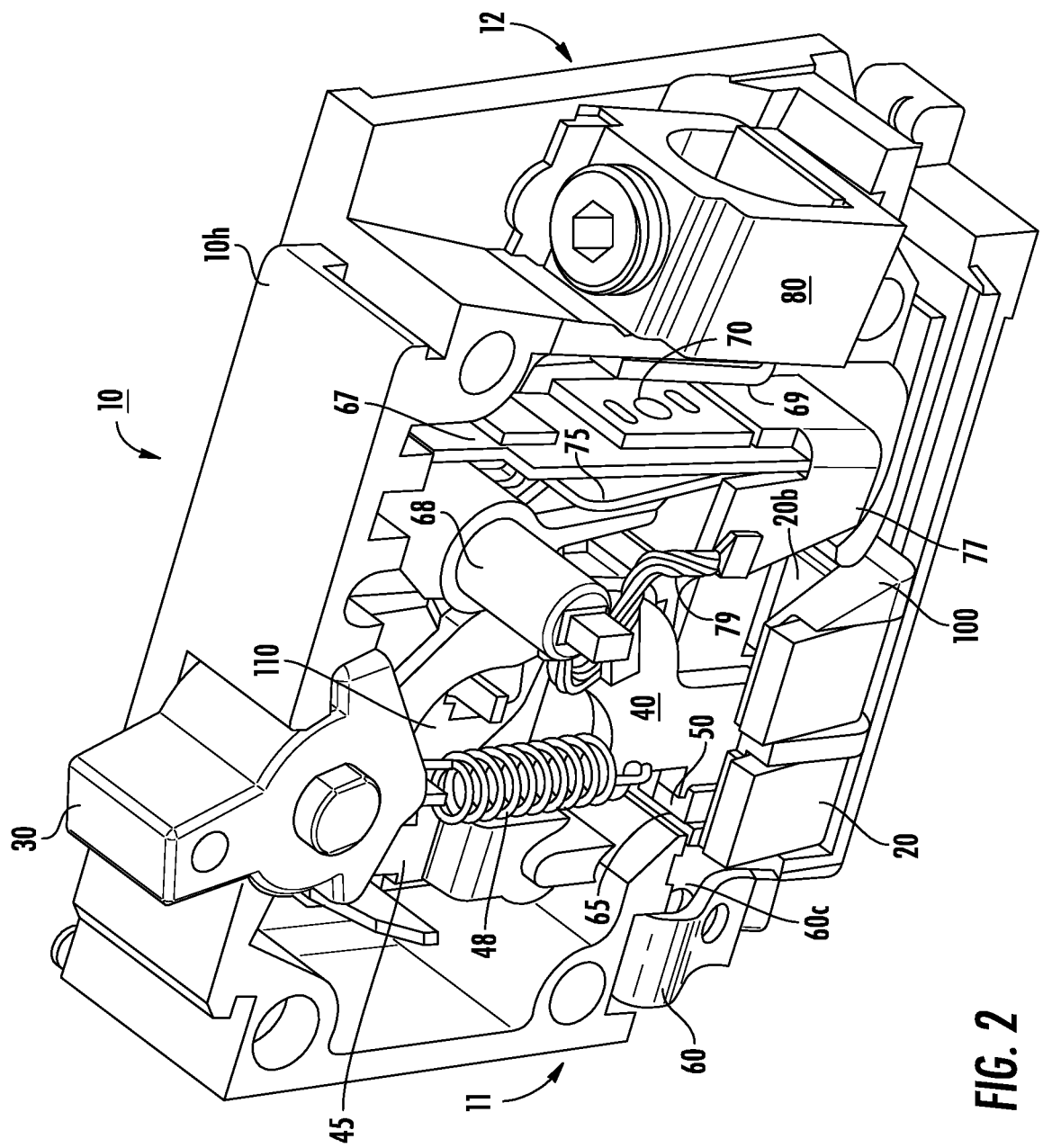
FIG. 2 is an enlarged side perspective view of an example circuit breaker with certain components omitted to show internal components according to embodiments of the present invention.
Figure 3:
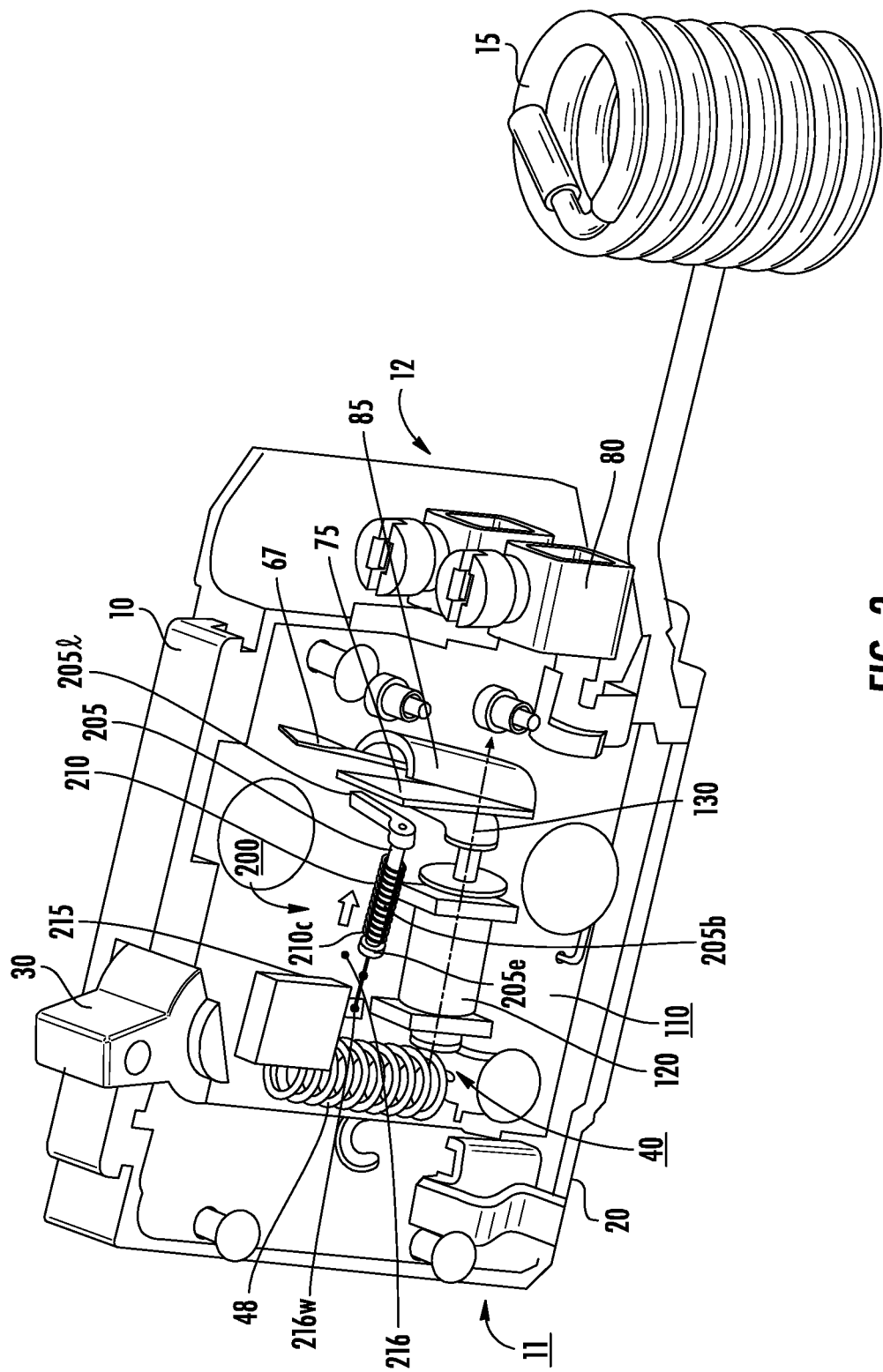
FIG. 3 is a side perspective view of an example circuit breaker with further components omitted to more clearly illustrate an example lock out feature or sub-assembly according to embodiments of the present invention.

Turning now to the figures, FIGS. 1-3 illustrate an example circuit breaker 10, with a case or housing 10h, a handle 30, a line side 11 and a load side 12. The load side 12 of the housing 10h may include a foot 10f. The circuit breaker 10 can be configured to engage an external plug-on neutral and/or a bolt on neutral 15, shown as a coiled "pigtail" neutral, with an internally located end portion 15i. In some embodiments, a neutral clip assembly can be used as an alternative to the pigtail conductor 15 of breakers to connect neutral or ground bars (not shown). See, e.g., U.S. patent application Ser. No. 15/840,029, filed Dec. 13, 2017, the content of which is hereby incorporated by reference as if recited in full herein.

The circuit breaker 10 can also include an arc chute 20, an optional arc quenching member 100 held on the arc chute 20, a movable contact arm 40 with an electrical contact 50, a line terminal assembly 60 with a line conductor 60c and comprising a stationary electrical contact 65. As shown, the movable contact arm 40 engages a handle 30 and a mechanism spring 48. The circuit breaker 10 can also include at least one trip cam 68, a cradle 45, a bimetal member 67, a collar assembly 80, a load terminal 69, a magnet 70, an armature 75, a shunt bracket 77, a shunt 79, a magnet 85 and a printed circuit board 110, for example.

Pins 19 can couple housing members together with the printed circuit board 110 and other components therein.

Figure 4:
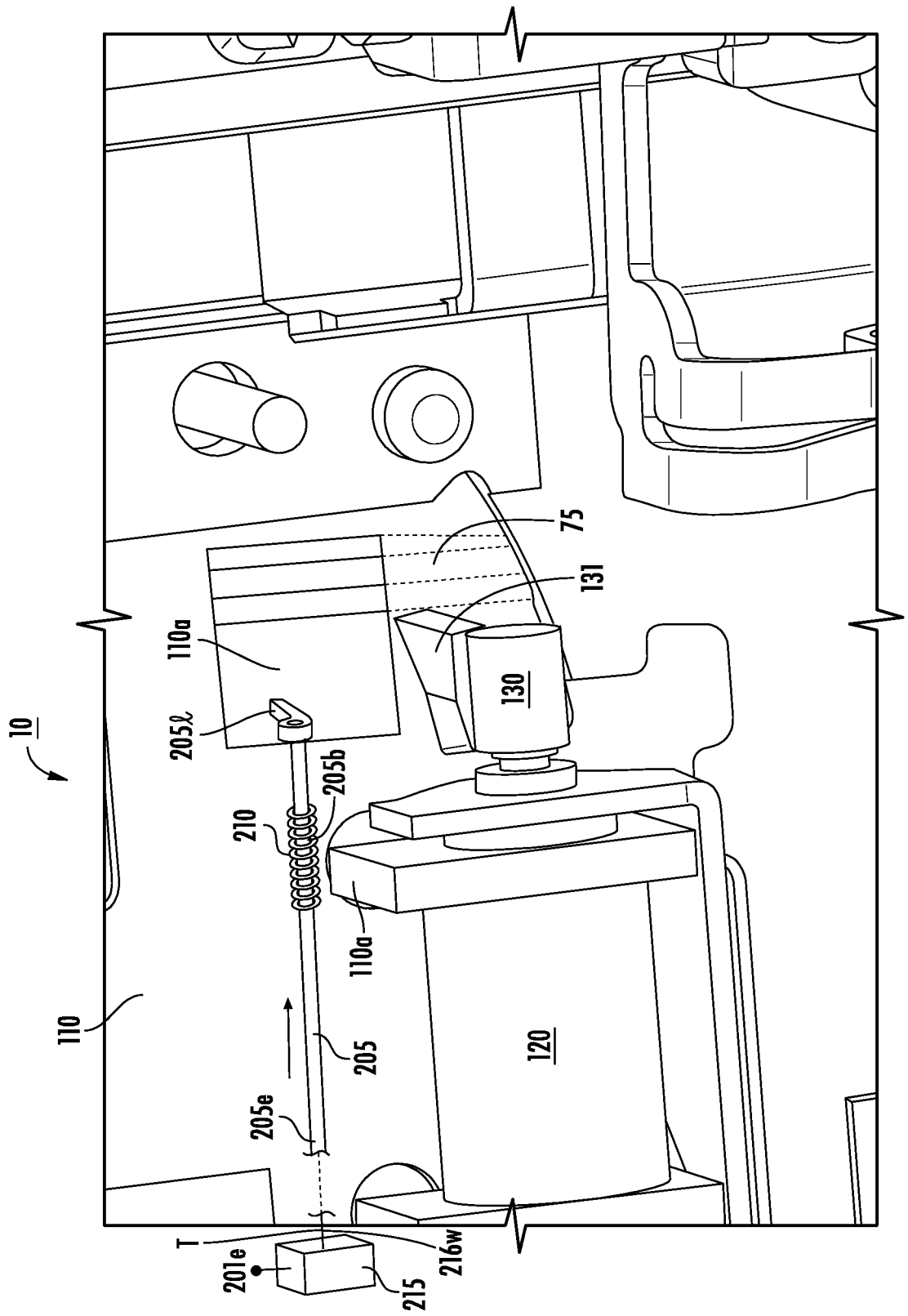
FIG. 4 is a greatly enlarged partial interior view of an example circuit breaker with lockout feature and/or sub-assembly according to embodiments of the present invention.

As shown in FIG. 3 and FIG. 4, for example, the printed circuit board 110 can comprise a trip solenoid 120 and plunger 130 on one end of the solenoid 120. The printed circuit board 110 can include an aperture 110a that allows the plunger 130 to extend therethrough and move toward and away from the load side 12.

Still referring to FIGS. 3 and 4, as shown, the circuit breaker 10 can further comprise a lockout assembly 200 with a mechanical rod 205 that can directly or indirectly push the armature 75 towards the bimetal member 67 to block the primary current pathway of the breaker from conduction when in a lockout state. The rod 205 can have a single deployment action so as to be able to extend or deploy from an inactive or retracted position to a lockout configuration, i.e., translate only a single time toward the armature 75 to provide a permanent lock out state that cannot be reset without factory repair.

The rod 205 can be configured to have a single travel direction that can be straight forward, a single time without being able to reciprocate between extended and retracted positions. The rod 205 can reside adjacent the solenoid 120 (above the solenoid 120 in the orientation shown). The rod 205 can have a leading end 205*l* that faces the armature 75 and that can be perpendicular to the rod 205. The leading end 205*l* can be orthogonal to the primary body 205*b* of the rod 205 and extend through an aperture 110*a* in the PCB 110, in some embodiments.

As shown in FIG. 4, the PCB 110 can include first and second apertures 110*a*, one closer to the handle 30, than the other. However, the PCB 110 can comprise a single aperture 110*a* that can allow the solenoid plunger 130 and the leading end of the rod 205*l* to concurrently extend therethrough.

The leading end 205*l* of the rod 205 can reside adjacent the plunger 130 of the solenoid. Both the end of the plunger 131 and the leading end 205*l* of the rod 205 can extend through one or more apertures 110*a* in the PCB 110 and each can be configured to slidably travel forward. The solenoid plunger 130 can reciprocate between extended and retracted positions.

The leading end 205*l* of the rod 205 can be elongate and provide a suitable force and configuration to physically directly or indirectly push the armature 75 toward the bimetal member 67 and block the armature in the lockout position.

As shown in FIG. 3, the rod 205 can be coupled to a control device 215 that can retain the position of the rod 205 in a retracted configuration during a pre-installation and in-service lifetime, prior to deployment to an extended position toward the armature 75 and/or bimetal member 67 when in a (permanent) lockout configuration for an end of life condition. The lockout assembly 200 can cause or force the rod 205 to push the armature 75 toward the bimetal member 67, and, when fully deployed can thereby provide a permanent lockout function, preventing the breaker 10 from being reset and/or trips the cradle 45 and/or movable arm 40 causing contacts 50, 65 to open if the breaker 10 was in a closed position at time of deployment of the rod 205 to the permanent lockout state.

The lockout assembly 200 can also comprise a biasing member 210 that is coupled to the rod 205 between the leading end 205*l* and the control device 215. The biasing member 210 can be configured to push the rod 205 forward toward the load side 12 of the housing 10*h* to the lockout configuration, typically when the rod 205 is released by the control device 215.

The biasing member 210 can be provided by one or more coil springs, as shown, or other resilient members such as one or more leaf spring, one or more dome spring washers, one or more resilient and/or elastically deformable plugs or stacked dome spring washers, for example. Combinations of different types of biasing members 210 may be used.

As shown in FIG. 3, the biasing member 210 comprises a coil spring 210*c* that extends about an outer wall of the rod 205 for a distance, residing behind the leading end 205*l* and the opposing end 205*e*.

The control device 215 can cooperate with the rod 205 to hold the biasing member 210 in a compressed, biased and/or increased potential energy state relative to when the control device 215 allows the rod 205 to travel forward, pushed by the biasing member 210. The control device 215 can be an electromechanical device that can anchor a segment of the rod 205, shown as an end portion 205*e* of the rod 205, and controllably release the rod 205 in response to a control signal from a control circuit 500 (FIG. 10) and/or in response to current applied to an output such as a high impedance wire 216 (FIG. 3) by the control device 215.

The lockout assembly 200 can hold the rod 205 in the retracted configuration (FIGS. 3, 4, 5B) for the normal operating life/inactive then only deploy when in a (perma- nent) lockout state. When a lockout condition is activated or triggered, the control device 215 can allow the rod 205 to slide forward based on the potential energy provided by the biasing member 210 as the biasing member 210 moves to a lower potential energy (less compressed or decompressed configuration). The control device 215 can release the rod 205 to allow the end of the rod 205*e* to be free. Alternatively, for example, as shown in FIG. 4, the control device 215 can comprise a tether T or other extension feature that can allow the rod 205 to travel forward, using the stored potential energy from the biasing member 210, while still coupled to the control device 215.

The rod 205 can be released from its anchored pre-deployment position by the control device 215 to be able to travel forward only when the breaker 10 reaches an end of life condition resulting in permanently preventing the breaker 10 from being re-energized.

The control device 215 can comprise an electronic component 216 that allows the rod 205 to slide forward when sufficient current is passed about, through or to the component 216. The electronic component 216 can comprise an inductor, capacitor, FET, resistor, and/or a length of (fusible) wire which can be a thin length of high impedance wire 216*w* (FIGS. 3, 4) that can be caused to "fuse" open to separate or disconnect from the rod 205 when current is passed through the electronic component 216.

The lockout assembly 200 can be configured to hold an element under spring tension that is held in "ready to fire position" with a thermoplastic link wrapped with resistive wire 216*w* and the wire 216*w* can be energized with current causing the wire 216*w* to heat up and melt the thermoplastic link 216*p*, this then allows the element 205 to travel (spring) into place to a permanent lockout configuration.

Where used, the wire 216*w* can comprise a single filament or multiple filament wire of a single material or comprising more than one material, optionally twisted together. The wire 216*w* can be flexible or malleable. The term "flexible" means the wire is unable to hold its shape without support and can be bent and folded. The wire 216*w* can have a length in a range of about 0.001 inches and 6 inches, more typically in a range of about 0.01 inches and 3 inches, in some particular embodiments. The wire 216*w* can comprise thin gauge wire, such as 20 AWG to 40 AWG wire, and/or a relatively low melting temperature wire. The amperage of current used to deploy the rod 205 can be a value high enough to cause the wire 216*w* to fuse open. The wire 216*w* can comprise copper or any other suitable metal or suitable alloy. The wire 216*w* can have greater electrical resistivity than copper to increase the fusing/disconnect speed. By way of example only, if the electronic component 216 comprises a metal wire 216*w* as a fusible link, the wire 216*w* can comprise 0.15 mm copper wire that melts if greater than 3 A of current is passed through it. However, other diameter wire, other wire material and other current values to cause the fusing action may be used.

Figure 7:
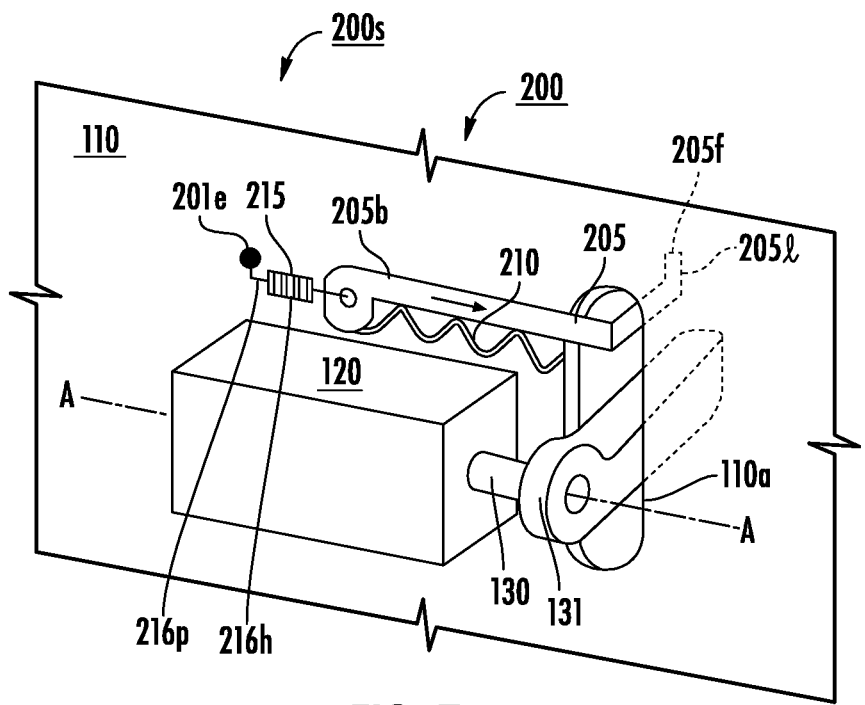
FIG. 7 is a schematic illustration of a lock-out sub-assembly according to embodiments of the present invention.

As shown in FIG. 7, the control device 215 can comprise a polymer or plastic member 216*p* (also termed a "polymer or fusible" link member) and a cooperating inner or outer casing of a heating element 216*h*, such as a length of wire wrapped about the polymer or plastic member 216*p*. When current is passed through the heating element 216*h*, heat is applied to the polymer or plastic member 216*p*, causing the polymer or plastic member 216*p* to melt, fragment and/or deform to release the rod 205 from its anchored pre-deployment position. The heating element 216*h* can comprise a flexible or malleable wire coiled or otherwise routed about the polymer or plastic member or link. The wire can comprise thin gauge wire, such as 20 AWG to 40 AWG wire.

Electrical current can be applied to a (fuse) wire 216w and resistivity of the wire 216w can heat the fusible polymeric and/or plastic link 216p causing the member 216p to melt, fragment and/or deform to release the rod 205 from its pre-deployed position.

The polymer or plastic member 216p can comprise an ABS (Acrylonitrile Butadiene Styrene) thermoplastic and amorphous polymer forming a fusible link which can be used with or used in place of a thin fusible wire discussed above in the control device 215. Instead of applying sufficient current to fuse open the electronic component (i.e., wire 216w) in order to release the stored energy in the biasing member 210, this embodiment can apply current to a length of resistance-wire as the heating element 216h, such as nickel chromium, kanthal A-1, and the like, coiled around the fusible link 216p to cause heating to a level of about 220 deg. C. at which point the (ABS) link member 216p will melt, releasing the stored energy of the biasing member 210 causing the rod 205 to extend to the lockout position. For example, about two inch length of 30 gauge Nichrome wire can heat to 240 deg. C. when 1 A (ampere) of current is applied at 1.2 v if this wire is coiled around the fusible link 216p and this is sufficient to melt or fragment the link 216p causing it to release the lockout out rod 205.

When in the end-of-life lockout state provided by the mechanical rod 205, the contacts 50, 65 (FIG. 2) of the breaker mechanism, i.e., the moving contact 50 and the stationary contact 65, are separated.

Figure 5A:
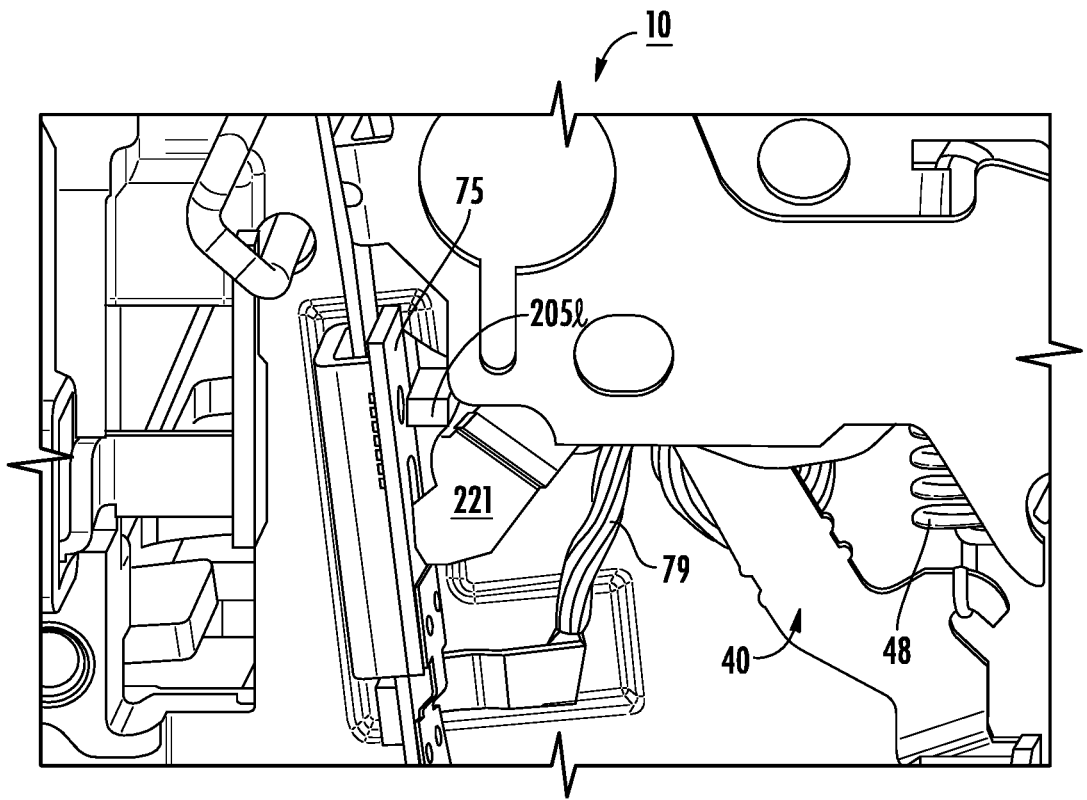
FIG. 5A is an enlarged partial view of a circuit breaker showing a lockout configuration to prevent conduction according to embodiments of the present invention.
Figure 5B:
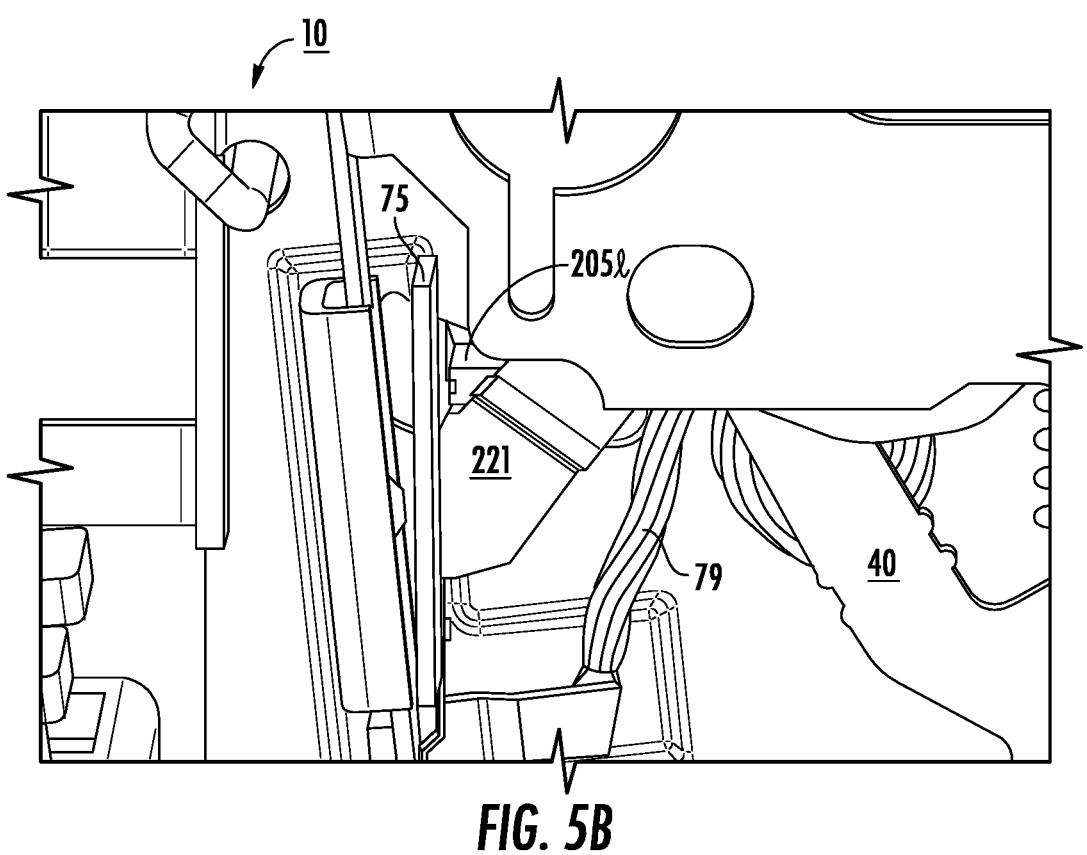
FIG. 5B is an enlarged partial view of the lock out feature disengaged in an unblocked configuration allowing conduction according to embodiments of the present invention.

FIGS. 4, 5A illustrate that the leading end 205l of the rod 205 can slide forward to push the armature 75 against the bimetal member 67 for the permanent lockout state. The control device 215 can comprise one or more electrical contacts 201e that can be coupled to a control circuit (block 500, FIG. 10). FIG. 5B illustrates a normal pre-lockout state configuration with the leading end 205l of the rod 205 retracted during pre-installation and normal service life of the breaker.

The leading end 205l of the rod 205 can reside above a latch link 221 as shown in FIGS. 5A, 5B.

Figure 6:
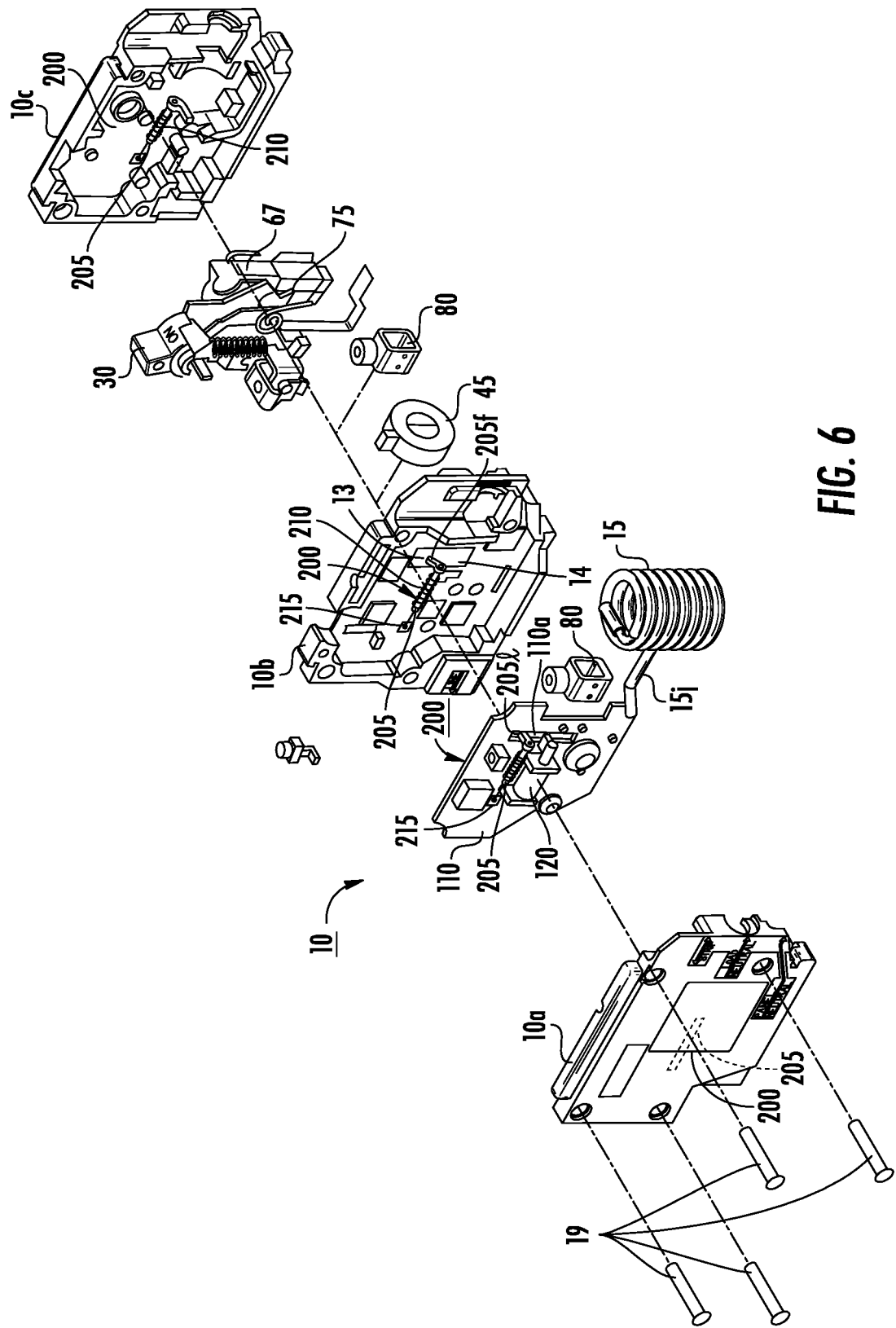
FIG. 6 is an exploded view of another example circuit breaker with a lock out feature or sub-assembly according to embodiments of the present invention.

As shown in FIG. 6, the breaker 10 can include a housing 10h which can include a top cover 10a, a bottom cover 10c and an intermediate or "middle" base 10b. FIG. 6 illustrates that the lockout assembly 200 can be coupled to various components. Although shown with each of the PCB 110, the middle base 10b and the top and bottom covers 10a, 10c, typically, the lockout assembly 200 or at least the rod 205 and biasing member 210 are (directly) attached to only one of these. For example, the lockout assembly 200 can be coupled to the PCB 110 with the rod 205 held over a portion of the primary surface of the PCB 110 adjacent the solenoid 120 as shown and the PCB 110 can be held by the middle base 10b.

Alternatively, as also shown, the lockout assembly 200 can be provided as part of the middle base 10b. The rod 205 can be under the PCB closer to the armature 67 than the solenoid 120. The control device 215 can be held by the PCB 110 or the middle base 10b. The biasing member 210 can be coupled to the rod 205 whether the rod 205 is held by the middle base 10b or the PCB 110. The middle base 10b can also hold a current transformer 45 and receive the PCB 110.

The middle base 10b can include an aperture 13 that allows the leading end 205l of the rod 205 to extend therethrough to align with the armature 75. The middle base 10b can also include an aperture 14 that allows the flag or end of the plunger 131 to extend therethrough. Of course, the apertures 13, 14 can be enlarged to define a single aperture configured to receive both the leading end of the rod 205l (with a laterally extending segment 205f) and the flag/end of the plunger 131 to concurrently extend therethrough, as indicated by the combined perimeter for features 13, 14 in FIG. 6.

Alternatively, as also shown, the lockout assembly 200 can be provided as part of the top cover 10a or the bottom cover 10c. For the bottom cover 10c, the leading end 205l of the rod 205 can extend inward to be between the PCB 110 and bottom cover, closer to the armature 67 than the solenoid 120 is. The control device 215 can be held by the PCB 110 or the middle base 10b. The biasing member 210 can be coupled to the rod 205 whether the rod 205 is held by the middle base 10b or the PCB 110.

As also shown in FIG. 6, for example, the circuit breaker 10 can include at least one neutral busbar 65 with spaced apart connectors and/or connector features that can attach to the printed circuit board 110. FIG. 6 also illustrates that the biasing member can reside between the rod 205 and the solenoid 130 and is not required to surround the primary body 205b of the rod 205.

FIG. 7 illustrates that the lockout assembly 200 can be provided as a separate, stand-alone sub-assembly 200s that can reside either under a primary surface of the PCB 110, over a primary surface of the PCB 110 or integrated, at least partially, into the top or bottom cover 10a, 10b or middle base 10b (FIG. 6). The sub-assembly 200s can comprise one or more electrical contacts 201e that can be coupled to a control circuit (block 500, FIG. 10) for providing a control signal to deploy the rod 205 for the lock out state.

Figure 8:
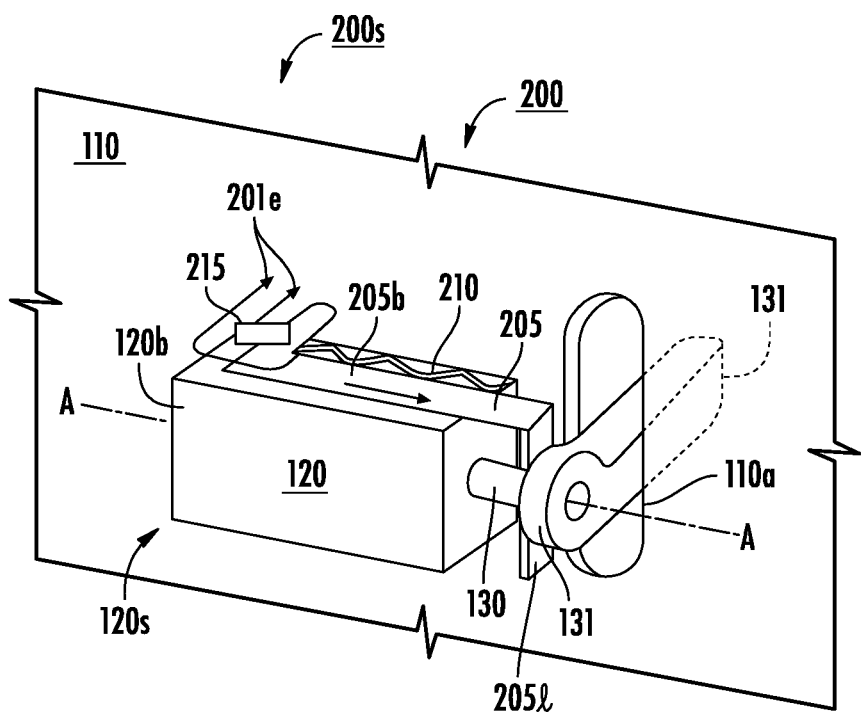
FIG. 8 is a schematic illustration of a lock-out integrated into a solenoid sub-assembly according to embodiments of the present invention.

FIG. 8 illustrates that the lockout assembly 200 can be integrated into the solenoid sub-assembly 120s. As shown, the rod 205 can be supported by the solenoid 120. The biasing member 210 and/or the control device 215 can be coupled to the solenoid 120.

FIGS. 7 and 8 also illustrate that the leading end 205l of the rod 205 can face the armature 75, perpendicular to a primary body 205b of the rod 205 and also perpendicular to an axis of translation A-A of a plunger 130 of the primary trip solenoid 120.

FIG. 8 also illustrates that the rod 205 can push on the plunger 130 of the primary trip solenoid 120 to indirectly interact with the armature 75 for the lockout state. The leading end 205l of the rod 205 can reside between the solenoid 120 and the plunger 130 or flag 131 and can be perpendicular to the primary body 205b and the plunger 130 and flag 131. In this embodiment, the leading end 205l of the rod 205 is not required to extend through the aperture 110a in the PCB 110. The rod 205 can be coupled to an external casing 120b of the primary trip solenoid 120 with one or more electrical contacts 201e of the control device 215, coupled to a control circuit (block 500, FIG. 10) for providing a control signal to deploy the rod 205 for the lock out state.

Thus, the rod 205 can interact with the armature 75 directly or indirectly. The rod can push on the flag 131 or plunger 130 of the primary tripping solenoid 120 as one indirect interaction configuration. The rod 205 and biasing member 210 can be separate components. The biasing member 210 and the rod 205 can be an integral component, optionally molded from a polymeric material with the rod having a rigid configuration and the biasing member formed with a resilient or elastically deformable portion.

Figure 9:
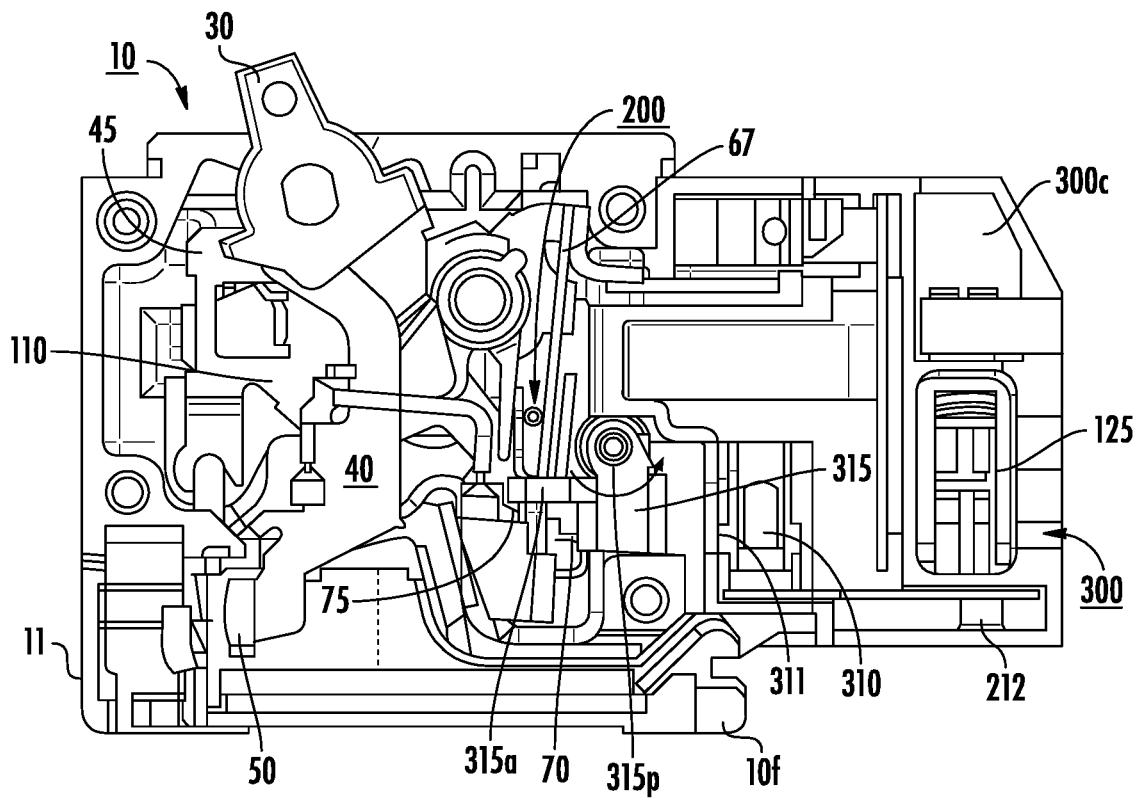
FIG. 9 is side view of a circuit breaker with an example of a cooperating ground fault module according to embodiments of the present invention.
Figure 11:
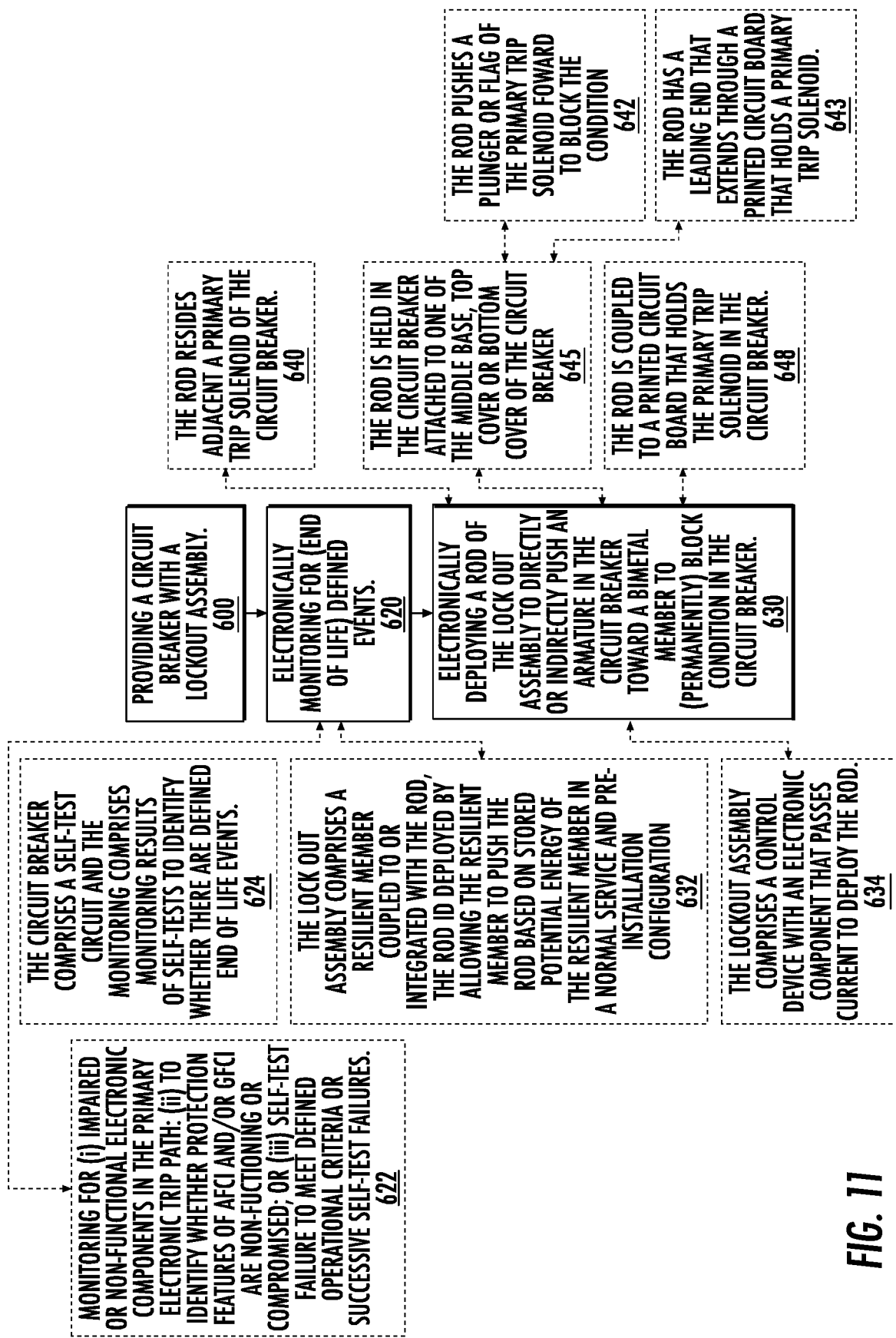
FIG. 11 is a flow chart of example actions that can be used to control a circuit breaker according to embodiments of the present invention.

FIG. 9 illustrates an example circuit breaker 10 with a ground fault module 300 comprising a ground fault circuit 300c. FIG. 11 of U.S. patent application Ser. No. 15/883, 676, the content of which is hereby incorporated by reference as if recited in full herein, illustrates an example schematic circuit diagram of an exemplary two-pole ground fault circuit 300c for the ground fault module 300. Other round fault circuit configurations may be employed as will be known to those of skill in the art. AFCI configurations may also or alternatively be used with the lockout assembly 200.

A lever 315 can be pivotably coupled to the housing 11 to be able to pivot about a pivot joint 315p. The lever 315 is sized and configured to be able to be magnetically pulled toward a magnetized or magnetic member 311 in the ground fault module 300. The lever 315 can have an arm 315a that extends toward the movable arm 40 and can reside in front of the armature 75. The magnetized or magnetic member 311 pulls the lever 315 via magnetic attraction in a direction away from the line side contact terminal assembly 60 which unlatches the circuit breaker 10 in a trip event. The member 311 can comprise or be configured as a plunger that is held by the solenoid assembly 310 and is linearly moveable in a direction toward and away from the lever 315. The ground fault module 300 can also include a printed circuit board 311 and collar assembly 125.

Figure 10:
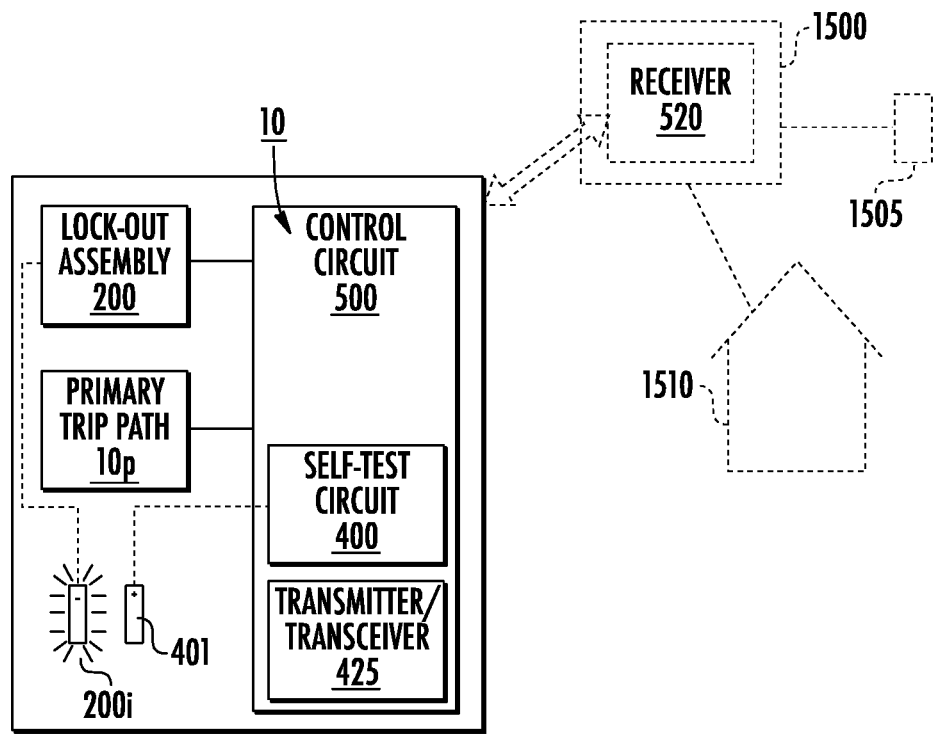
FIG. 10 is a schematic illustration of a circuit interrupter system according to embodiments of the present invention.

FIG. 10 illustrates that the circuit breaker 10 can include a self-test circuit 400 which can be incorporated into or in communication with a control circuit 500. The circuit breaker 10 can include a self-test input member 401 and can include a lock out status visual indicator 200i. The control circuit 500 can comprise at least one processor and can electronically signal or trigger the lockout assembly 200 to deploy to a lockout state when an end of life condition exists based on one or more defined and identified conditions or events of the breaker 10. For example, if protection features (AFCI, GFCI, etc.) are compromised; if a self-test detects that the primary electronic trip path 10p such as the SCR (silicon controlled rectifier) or solenoid 120, for example, is compromised or damaged, shorted or burned; or if a quality or status test by the self-test fails and/or a forced reset is required greater than a defined number within a defined time frame.

The control circuit 500 can include or be in communication with a transmitter and/or transceiver 425 that can wirelessly communicate with a receiver 520 when an end of life condition is believed to have occurred prior to or concurrent with the deployment of the lockout assembly 200 to the lock out state. The wireless receiver 520 can be in communication with a remote server 1500, smartphone 1505, home monitoring system 1510, or other device to allow a (permanent) lock out alert to be sent to a user, monitoring service or utility service, for example.

FIG. 11 is a flow chart of actions that can be used to create a lockout condition in a circuit breaker. A circuit breaker with a lockout assembly is provided (block 600). Defined events, typically end of life events, can be electronically monitored (block 620). A rod of the lock out assembly is deployed to directly or indirectly push an armature in the circuit breaker toward a bimetal member to (permanently) block conduction in the circuit breaker (block 630) based on identification or detection of one or more of the electronically monitored defined events.

The monitoring can include monitoring for one or more of: (i) impaired or non-functional electronic components in the primary electronic trip path; (ii) to identify whether protection features of AFCI and/or GFCI are non-functioning or compromised; or (iii) self-test failure to meet defined operational criteria or successive self-test failures (block 622).

The circuit breaker can comprise a self-test circuit and the monitoring can comprise monitoring results of self-tests to identify whether there are defined end of life events (block 624).

The rod can reside adjacent a primary trip solenoid of the circuit breaker (block 640).

The rod can be held in the circuit breaker attached to one of the middle base, top cover or bottom cover of the circuit breaker (block 645).

The rod can be coupled to a printed circuit board that holds the primary trip solenoid in the circuit breaker (block 648).

The rod can push a plunger or flag of the primary trip solenoid forward to block the conduction (block 642).

The rod can have a leading end that extends through a printed circuit board that holds a primary trip solenoid (block 643).

The circuit breakers 10 can be rated for voltages between about 1V to about 5000 volts (V) DC and/or may have current ratings from about 15 to about 2,500 Amps. The circuit breakers 10 may be high-rated miniature molded case circuit breakers, e.g., 240V and above about 70 A in a compact package. However, it is contemplated that the circuit breakers 10 and components thereof can be used for any voltage, current ranges and are not limited to any particular application as the circuit breakers can be used for a broad range of different uses.

The circuit breakers 10 can be molded case circuit breakers (MCCB)s. MCCBs are well known. See, e.g., U.S. Pat. Nos. 4,503,408, 4,736,174, 4,786,885, and 5,117,211, the contents of which are hereby incorporated by reference as if recited in full herein. The circuit breakers 10 can be a bi-directional DC MCCB. See, e.g., U.S. Pat. No. 8,222,983, the content of which is hereby incorporated by reference as if recited in full herein. The DC MCCBs can be suitable for many uses such as data center, photovoltaic, and electric vehicle applications.

As is known to those of skill in the art, Eaton Corporation has introduced a line of MCCBs designed for commercial and utility scale photovoltaic (PV) systems. Used in solar combiner and inverter applications, Eaton PVGard™ circuit breakers are rated up to 600 Amp at 1000 Vdc and can meet or exceed industry standards such as UL 489B, which requires rigorous testing to verify circuit protection that meets the specific requirements of PV systems. However, it is contemplated that the circuit breakers 10 can be used for various applications with corresponding voltage capacity/rating.

In some embodiments, the circuit breakers 10 can be DC circuit breakers, AC circuit breakers, or both AC (alternating current) and DC (direct current) circuit breakers.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed:

1. A circuit breaker, comprising:
a housing with a line side and a load side;
a printed circuit board in the housing;
a movable contact arm with an electrical contact;
a stationary line side electrical contact;
a primary trip solenoid in the housing coupled to the printed circuit board;
an armature in the housing;
a bimetal member in the housing adjacent the armature and adjacent the primary trip solenoid; and
a lockout assembly in the housing, the lockout assembly comprising a rod configured to have a first inactive position and a second lockout position, wherein, only when in the second lockout position and/or as the rod travels to the second lockout position, the rod directly or indirectly pushes the armature toward the bimetal member to physically lock out the circuit breaker to prevent conduction and separate the line side electrical contact from the movable contact arm electrical contact,
wherein the lockout assembly comprises a control device that anchors the rod in the first position, pre-installation and during in service operation, and wherein the control device is configured to allow the rod to slidably advance only a single time to the second lockout position in response to an electronically automatically identified end-of-life condition.

2. The circuit breaker of claim 1, further comprising a resilient biasing member that cooperates with the rod, wherein the resilient biasing member is configured to have a compressed state when the rod is in the first position to have stored potential energy, and wherein the resilient biasing member is configured to apply the stored potential energy to the rod when released by the control device to force the rod to slidably travel to the second lockout position.

3. The circuit breaker of claim 1, wherein the control device comprises a component that allows electric current above a defined threshold to fuse open the component and release the rod.

4. The circuit breaker of claim 1, wherein the rod comprises a leading end that faces the armature, and wherein the leading end is perpendicular to a primary body segment of the rod.

5. The circuit breaker of claim 4, wherein the leading end extends through an aperture in the printed circuit board adjacent a plunger of the primary trip solenoid.

6. The circuit breaker of claim 5, wherein the primary trip solenoid comprises a plunger and/or flag that has a leading end that is perpendicular to a primary body of the primary trip solenoid, and wherein the leading end extends through the aperture or a different aperture in the printed circuit board adjacent the leading end of the rod.

7. The circuit breaker of claim 1, wherein the rod comprises a leading end that faces the armature, wherein the leading end is perpendicular to a primary body segment of the rod and is also perpendicular to an axis of translation of a plunger of the primary trip solenoid, behind a leading end of the plunger, and wherein the leading end of the rod forces the leading end of the plunger and/or a flag thereon to move forward as the leading end of the rod moves to the second lockout position.

8. The circuit breaker of claim 1, wherein the rod is held by a middle base of the housing.

9. The circuit breaker of claim 8, wherein the middle base comprises a first aperture that allows a flag of a plunger to extend therethrough, and wherein the middle base comprises a second aperture that allows a leading end of the rod to extend therethrough adjacent the flag of the plunger.

10. The circuit breaker of claim 1, wherein the middle base comprises an aperture that allows a flag of a plunger to extend therethrough and that also allows a leading end of the rod to concurrently extend therethrough adjacent the flag of the plunger.

11. The circuit breaker of claim 1, wherein the rod is held by a top cover of the housing.

12. The circuit breaker of claim 1, wherein the rod is held by the printed circuit board.

13. The circuit breaker of claim 1, wherein the rod is held by a bottom cover of the housing.

14. The circuit breaker of claim 1, wherein the rod is coupled to an external casing of the primary trip solenoid.

15. The circuit breaker of claim 1, wherein the circuit breaker is an Arc Fault Circuit Interrupter (AFCI), a Ground Fault Circuit Interrupter (GFCI) or a dual purpose AFCI/GFCI circuit breaker.

16. The circuit breaker of claim 1, further comprising a coil spring coupled to the rod and spaced apart from a leading end of the rod, and wherein the control device comprises a fusible wire or fusible polymer or plastic link that is attached to the rod in the first inactive position.

17. The circuit breaker of claim 1, further comprising a control circuit in communication with the control device, wherein the control circuit is configured to trigger the control device to controllably deploy the rod of the lock-out assembly to the second lockout position only when the electronically automatically identified end of life condition is identified.

18. The circuit breaker of claim 17, wherein the automatically identified end of life condition comprises one or more of:
a defined number of successive failed self-tests of a self-test circuit onboard the circuit breaker;
an identified failure or degradation in a defined performance parameter or parameters of electronic components in the circuit breaker;
AFCI or GFCI protection features are at least one of inoperable, outside defined operating parameters or malfunctioning; or
solenoid or SCR (silicon controlled rectifier) components of a primary electronic trip path are shorted, burned or otherwise damaged.

19. A method of operating a current interrupter comprising:
providing a circuit interrupter with a permanent lockout assembly;
electronically monitoring or testing or monitoring and testing for defined end-of-life conditions or events of the circuit interrupter; and
automatically deploying a rod of a lock out assembly to slide toward an armature and push the armature toward a bimetal member to permanently block conduction of the circuit interrupter,
wherein the rod is configured to have a first inactive position and a second lockout position, wherein, only when in the second lockout position and/or as the rod travels to the second lockout position in response to the deployment, the rod directly or indirectly pushes the armature toward the bimetal member to physically lock out the circuit breaker to prevent conduction and separate the line side electrical contact from the movable contact arm electrical contact, wherein the rod is anchored in the first inactive position, pre-installation and during in service operation, and wherein the automatic deployment is carried out by slidably advancing the rod only a single time to the second lockout position in response to when an end of life condition or event of the defined end-of-life conditions or events is identified by the electronically monitoring or testing or monitoring and testing.

20. The method of claim 19, wherein the monitoring or testing or monitoring and testing for the defined end-of-life conditions or events comprises one or more of electronically:

determining a defined number of failures of successive self-tests of a self-test circuit;

identifying a failure or degradation in a defined performance parameter or parameters of electronic components in the circuit interrupter;

determining that AFCI or GFCI protection features are inoperable, outside defined operating parameters or malfunctioning; or determining that a primary trip solenoid or SCR (silicon controlled rectifier) component of a primary electronic trip path is shorted, burned or otherwise damaged.

* * * * *